(12) United States Patent
Weng et al.

(10) Patent No.: US 12,619,154 B2
(45) Date of Patent: *May 5, 2026

(54) LITHOGRAPHY TECHNIQUES FOR REDUCING DEFECTS

(71) Applicant: TAIWAN SEMICONDUCTOR MANUFACTURING COMPANY, LTD., Hsinchu (TW)

(72) Inventors: Ming-Hui Weng, New Taipei City (TW); Ching-Yu Chang, Yilan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 11 days.

This patent is subject to a terminal disclaimer.

(21) Appl. No.: 18/675,505

(22) Filed: May 28, 2024

(65) Prior Publication Data

US 2024/0310735 A1 Sep. 19, 2024

Related U.S. Application Data

(63) Continuation of application No. 17/206,112, filed on Mar. 18, 2021, now Pat. No. 12,025,920.

(51) Int. Cl.
| | |
|---|---|
| *G03F 7/40* | (2006.01) |
| *G03F 1/56* | (2012.01) |
| *G03F 7/039* | (2006.01) |
| *H10P 76/20* | (2026.01) |

(52) U.S. Cl.
CPC ................... *G03F 7/40* (2013.01); *G03F 1/56* (2013.01); *G03F 7/0392* (2013.01); *H10P 76/2041* (2026.01)

(58) Field of Classification Search
CPC ........................................................ G03F 7/40
See application file for complete search history.

(56) References Cited

U.S. PATENT DOCUMENTS

| | | | |
|---|---|---|---|
| 8,796,666 B1 | 8/2014 | Huang et al. | |
| 9,012,132 B2 | 4/2015 | Chang | |
| 9,028,915 B2 | 5/2015 | Chang et al. | |
| 9,093,530 B2 | 7/2015 | Huang et al. | |
| 9,146,469 B2 | 9/2015 | Liu et al. | |
| 9,213,234 B2 | 12/2015 | Chang | |
| 9,223,220 B2 | 12/2015 | Chang | |
| 9,256,133 B2 | 2/2016 | Chang | |
| 9,536,759 B2 | 1/2017 | Yang et al. | |
| 9,548,303 B2 | 1/2017 | Lee et al. | |
| 10,520,822 B2 | 12/2019 | Weng et al. | |
| 10,866,517 B2 * | 12/2020 | Weng | G03F 7/40 |
| 2019/0004430 A1 * | 1/2019 | Weng | G03F 7/40 |

* cited by examiner

*Primary Examiner* — Chanceity N Robinson
(74) *Attorney, Agent, or Firm* — NZ Carr Law Office

(57) ABSTRACT

A lithography method is described. The method includes forming a resist layer over a substrate, performing a treatment on the resist layer to form an upper portion of the resist layer having a first molecular weight and a lower portion of the resist layer having a second molecular weight less than the first molecular weight, performing an exposure process on the resist layer, and performing a developing process on the resist layer to form a patterned resist layer.

20 Claims, 19 Drawing Sheets

ALKENE TYPE

ALKENE TYPE

2,2'-Azobisisobutyronitrile (AIBN)

36

4,4-Azobis(4-cyanovaleric acid)

LITHOGRAPHY TECHNIQUES FOR REDUCING DEFECTS

CROSS-REFERENCE TO RELATED APPLICATIONS

This application is a continuation application of U.S. patent application Ser. No. 17/206,112 filed Mar. 18, 2021, which is incorporated by reference in its entirety.

BACKGROUND

Lithography processes are extensively utilized in integrated circuit (IC) manufacturing, where various IC patterns are transferred to a workpiece to form an IC device. A lithography process typically involves forming a resist layer over the workpiece, exposing the resist layer to patterned radiation, and developing the exposed resist layer, thereby forming a patterned resist layer. The patterned resist layer is used as a masking element during subsequent IC processing, such as an etching process, where a resist pattern of the patterned resist layer is transferred to the workpiece. The quality of the resist pattern directly impacts the quality of the IC device. As IC technologies continually progress towards smaller technology nodes (for example, down to 14 nanometers, 10 nanometers, and below), defects such as bridge (connected openings) and blind (partially filled openings) can occur. For example, using a high soluble polymer as the resist layer may lead to resist layer loss at non-exposed area, which induces bridge defect. On the other hand, using a low soluble polymer as the resist layer may lead to scum formation, and a subsequent de-scum process induces bridge defect. Accordingly, an improved lithography technique is needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4D illustrate chemical structures of a cross-linker that can be included in a resist material, such as the resist material of FIG. 1, in accordance with some embodiments.

DETAILED DESCRIPTION

Figure 1:
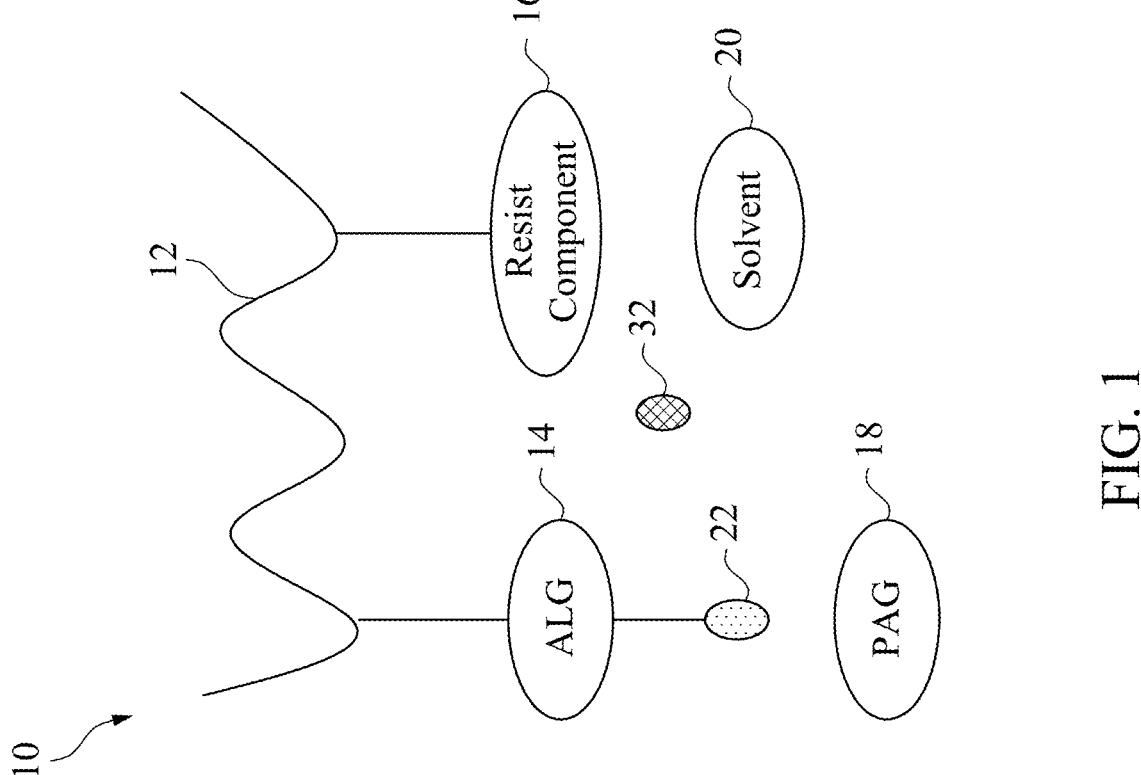
FIG. 1 illustrates a resist material that can be used for forming a resist layer, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A lithography process involves forming a resist layer over a workpiece and exposing the resist layer to patterned radiation, such as deep ultraviolet (DUV) patterned radiation, extreme UV (EUV) patterned radiation, or electron-beam (e-beam) patterned radiation. For advanced technology nodes (for example, 14 nanometers, 10 nanometers, and below), the lithography process implements radiation sources having ever decreasing wavelengths, such as radiation having a wavelength of less than about 250 nm, to meet finer lithography resolution limits. Advanced lithography materials, such as chemically amplified resist (CAR) materials, have been introduced to improve sensitivity of the resist layer to the radiation, thereby maximizing utilization of the radiation. CAR materials can generate multiple chemical reactions upon exposure to radiation, thereby chemically amplifying a response to the radiation. A resist layer formed from a CAR material includes a polymer that is resistant to an integrated circuit process (such as an etching process), an acid generating component (such as a photoacid generator (PAG)), and a solvent component. The PAG generates acid upon exposure to radiation, which functions as a catalyst for causing chemical reactions that increase (or decrease) solubility of exposed portions of the resist layer. For example, in some embodiments, acid generated from the PAG catalyzes cleaving of acid labile groups (ALGs) bonded (linked) to the polymer, thereby changing solubility of exposed portions of the resist layer.

After exposed to the patterned radiation, the resist layer is developed in a developer (in other words, a chemical solution). The developer removes portions of the resist layer (for example, exposed portions of positive tone resist layers or unexposed portions of negative tone resist layers), thereby forming a patterned resist layer. The patterned resist layer is used as a masking element during a subsequent process, such as an etching process or an implantation process, to transfer a pattern in the patterned resist layer (referred to herein as a resist pattern) to the workpiece. There are generally two types of developing processes: a positive tone development (PTD) process and a negative tone development (NTD) process. The PTD process uses a positive tone developer, which generally refers to a developer that selectively dissolves and removes exposed portions of the resist layer. The NTD process uses a negative tone developer, which generally refers to a developer that selectively dissolves and removes unexposed portions of the resist layer. PTD developers are typically aqueous base developers, such as tetraalkylammonium hydroxide (TMAH), and NTD developers are typically organic-based developers, such as n-butyl acetate (n-BA).

Both PTD processes and NTD processes have drawbacks when attempting to meet lithography resolution demands for advanced technology nodes. NTD processes often fail to produce sufficient developing contrast between exposed portions and unexposed portions of the resist layer (in other words, NTD processes result in poor resist contrast), resulting in higher than desired line edge roughness (LER), line width roughness (LWR), and/or low patterning fidelity. Though PTD processes can achieve high resist developing contrast, PTD processes have been observed to cause bridge and/or blind defects.

The present disclosure thus proposes resist materials and corresponding lithography techniques that can reduce the bridge and blind defects in a resist layer. In some embodiments, the proposed resist materials and corresponding lithography techniques provide a resist layer having increasing weight-average molecular weight of the polymer from a bottom of the resist layer to a top of the resist layer. In other words, the resist layer has higher molecular weight of the polymer at an upper portion of the resist layer and lower molecular weight of the polymer at a lower portion of the resist layer. Higher molecular weight of the polymer at the upper portion of the resist layer has a lower etch rate during the developing stage, thus reducing resist layer loss at the unexposed areas. Lower molecular weight of the polymer at the lower portion of the resist layer has a higher etch rate during the developing stage, thus reducing the formation of scums. Furthermore, the upper portion of the resist layer has higher molecular weight and higher glass transition temperature, which suppress acid diffusion. As a result, LWR and local critical dimension uniformity (LCDU) are improved.

FIG. 1 illustrates a resist material 10 that can be used for forming a resist layer during integrated circuit (IC) fabrication according to various aspects of the present disclosure. Characteristics (for example, solubility and/or polarity) of the resist material 10 change upon being exposed to radiation used during a lithography process, such DUV radiation (for example, 248 nm radiation from a KrF laser or 193 nm radiation from an ArF laser), EUV radiation (for example, 13.5 nm radiation), e-beam radiation, ion beam radiation, or other suitable radiation. The radiation may have a wavelength less than about 250 nm. For purposes of the following discussion, the resist material 10 is a positive tone resist material used to form a positive tone resist layer, where portions of the resist material 10 exposed to radiation become soluble to a developer and unexposed portions of the resist material 10 remain insoluble to the developer. FIG. 1 has been simplified for the sake of clarity to better understand the concepts of the present disclosure. Additional features can be added in the resist material 10, and some of the features described below can be replaced, modified, or eliminated in other embodiments of the resist material 10.

As shown in FIG. 1, the resist material 10 includes a polymer 12 having a resistance to an IC process used during IC fabrication. For example, the polymer 12 has an etch-resistance to an etching process and/or an implant-resistance to an implantation process. In some embodiments, the polymer 12 includes any number of carbons coupled in a carbon chain, thereby forming a carbon backbone chain. In some embodiments, the polymer 12 includes phenol formaldehyde resin, a poly(norbornene)-co-malaic anhydride (COMA) polymer, a poly(4-hydroxystyrene) (PHS) polymer, a phenol-formaldehyde (hakelite) polymer, a polyethylene (PE) polymer, a polypropylene (PP) polymer, a polycarbonate polymer, a polyester polymer, or an acrylate-based polymer, such as a poly (methyl methacrylate) (PMMA) polymer or poly (methacrylic acid) (PMAA).

Figure 2B:
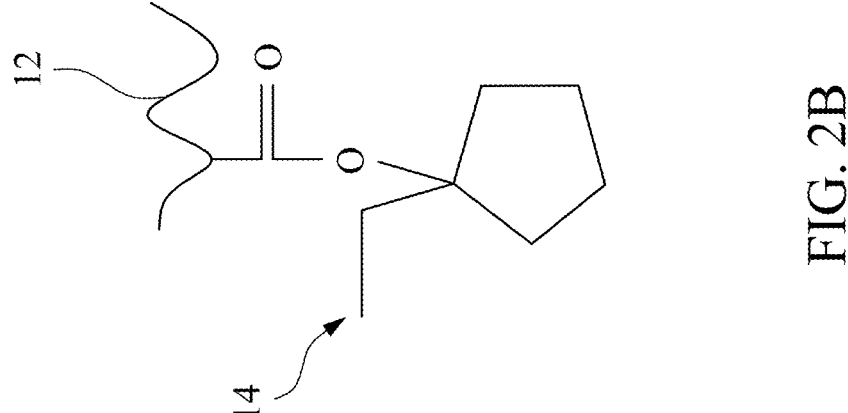
FIGS. 2A and 2B illustrate chemical structures of an acid labile group (ALG) component that can be included in a resist material, such as the resist material of FIG. 1, in accordance with some embodiments.
Figure 2A:
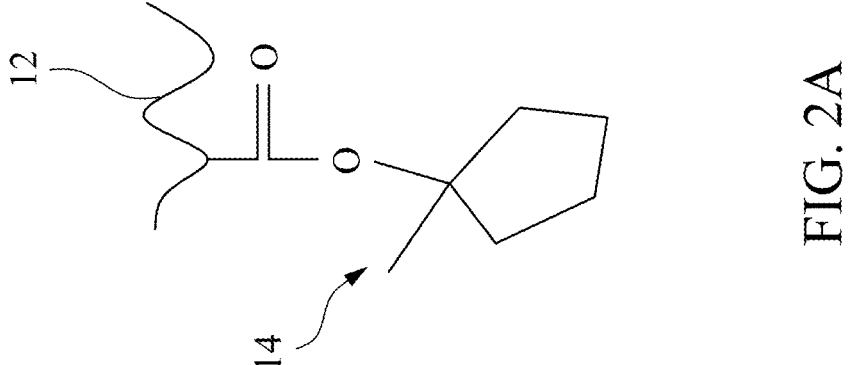

The polymer 12 has one or more functional groups chemically bonded (or linked) thereto, such as an acid labile group (ALG) component 14 (also referred to as a dissolution inhibitor) and a resist component 16. The ALG component 14 may chemically change the resist material 10 after the exposure stage. For example, the ALG component 14 is cleaved from the polymer 12 upon exposure to acid, thereby changing a solubility and/or polarity of exposed portions of resist material 10. In some embodiments, the ALG component 14 includes tert-butoxycarbonyl (tBOC). FIGS. 2A and 2B illustrate chemical structures of an exemplary ALG component, such as the ALG component 14, that is included in a resist material, such as the resist material 10, in according with some embodiments. As shown in FIG. 2A, the ALG component 14 is methylcyclopentyl (MCP) bonded to a carboxyl group of the polymer 12 (in particular, an oxygen of the carboxyl group) via covalent bonding. As shown in FIG. 2B, the ALG component 14 is ethylcyclopentyl bonded to a carboxyl group of the polymer 12 (in particular, an oxygen of the carboxyl group) via covalent bonding.

Figures 3A, 3B:
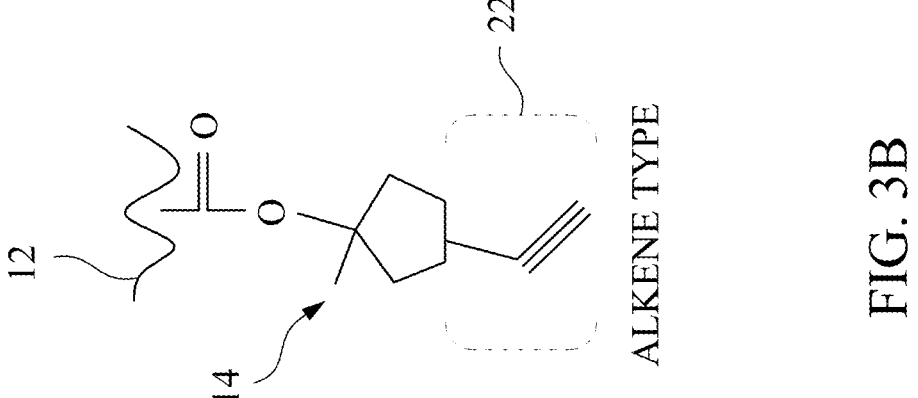
FIGS. 3A and 3B illustrate chemical structures of a cross-linking functional group that can be included in a resist material, such as the resist material of FIG. 1, in accordance with some embodiments.

Referring back to FIG. 1, in some embodiments, the ALG component 14 includes cross-linkable functional group 22, such as alkene, alkyne, triazene, or other suitable functional group. For example, the cross-linkable functional group 22 reacts with other cross-linkable functional groups in response to a treatment performed on a resist layer including the resist material 10, thereby cross-linking an upper portion of the resist layer. The treatment performed on a resist layer including the resist material 10 is described in detail in FIGS. 5A and 5B. FIGS. 3A and 3B illustrate chemical structures of exemplary cross-linkable functional groups, such as the cross-linkable functional group 22, that can be included in a resist material, such as the resist material 10, in according with some embodiments. The depicted cross-linkable functional groups facilitate cross-linking of ALG components of a resist material, such as the ALG component 14 of the resist material 10. As shown in FIG. 3A, the cross-linkable functional group 22 includes an alkene functional group bonded to ALG component 14. As shown in FIG. 3B, the cross-linkable functional component 22 includes an alkyne functional group bonded to ALG component 14.

Figures 4A, 4B, 4C, 4D:
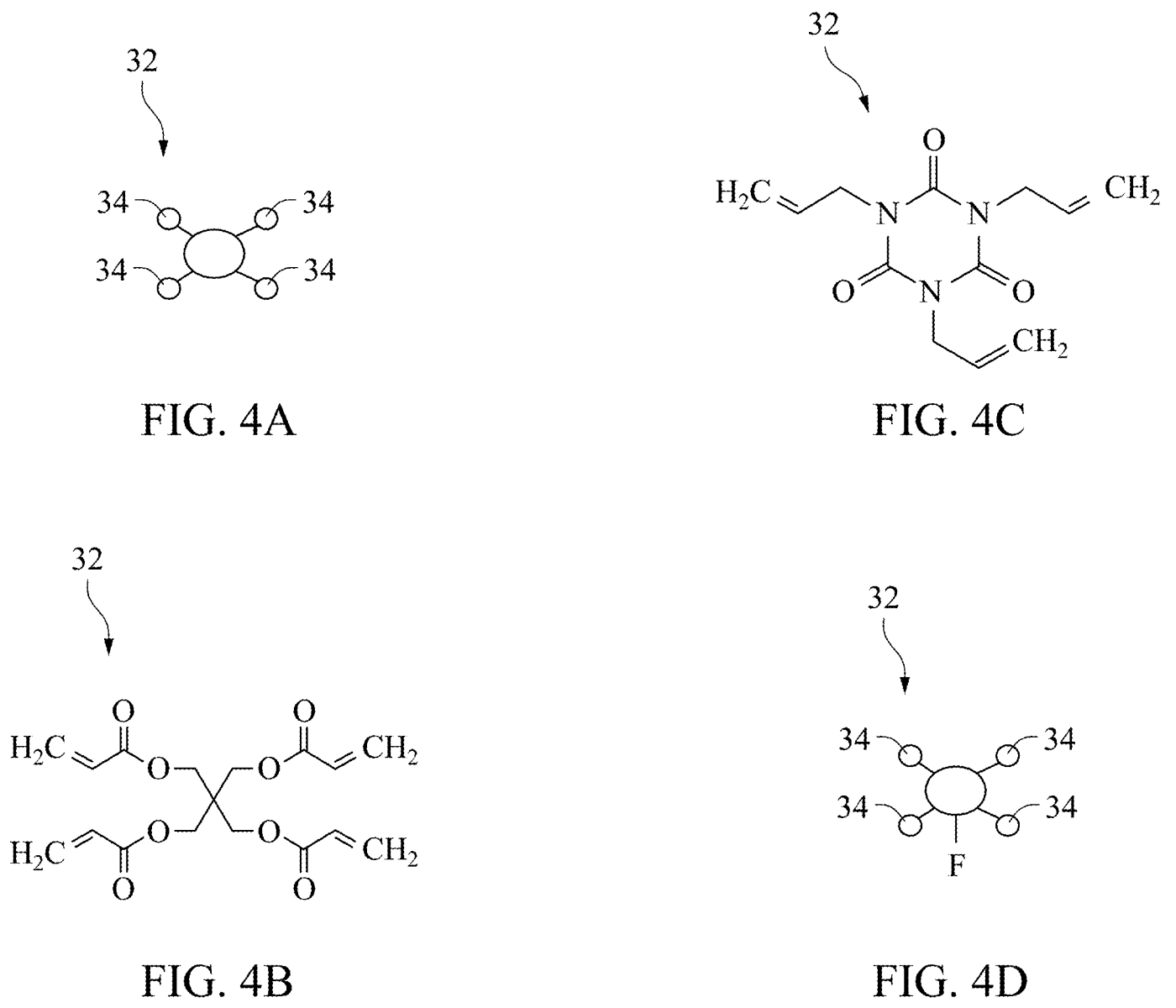

Referring back to FIG. 1, in some embodiments, a cross-linker 32 is utilized to facilitate crosslinking of cross-linkable functional group 22 with other cross-linkable functional groups (not shown) bonded to other ALG components (not shown) in response to a treatment performed on a resist layer including resist material 10, thereby cross-linking an upper portion of the resist layer. FIGS. 4A-4D illustrate chemical structures of exemplary cross-linkers, such as the cross-linker 32, that can be included in a resist material, such as the resist material 10, in according with some embodiments. As shown in FIG. 4A, the cross-linker 32 may include at least 2 cross-linkable functional groups 34, such as 4 cross-linkable functional groups 34, and each cross-linkable functional group 34 can be bonded to a cross-linkable functional group 22 (FIG. 1). In other words, the cross-linker 32 can be bonded to at least 2 ALG components 14. In some embodiments, the number of cross-linkable functional group 34 is greater than or equal to 3, in order to facilitate the formation of a resist layer having increasing molecular weight of the polymer from a bottom of the resist layer to a top of the resist layer. The cross-linkable functional group 34 may include alkene, alkyne, triazene, or other suitable cross-linkable functional group. As shown in FIG. 4B, the cross-linker 32 includes 4 alkene functional groups, which can bond to 4 cross-linkable functional groups 22. As shown in FIG. 4C, the cross-linker 32 includes three alkene functional groups, which can bond to 3 cross-linkable functional groups 22. As shown in FIG. 4D, the cross-linker 32 includes the cross-linkable functional groups 34 and fluorine. The fluorine-containing cross-linker 32 is floatable. For example, during the formation of the resist layer including the resist material 10, the fluorine-containing cross-linker 32 floats to the surface of the resist layer. The floatability of the fluorine-containing cross-linker 32 helps to achieve cross-linking an upper portion of the resist layer while a lower portion of the resist layer is not cross-linked. In some embodiments, the cross-linker 32 shown in FIGS. 4B and 4C may be modified to include fluorine. For example, fluorination of alkene may be performed to the cross-linker 32 shown in FIG. 4A to form the fluorine-containing cross-linker 32, as shown in FIG. 4D.

Referring back to FIG. 1, the resist component 16 may be chemically bonded (or linked to) the polymer 12. The resist component 16 is configured to interact with other components of the resist material 10. In some embodiments, the resist component 16 includes a thermal acid generator (TAG) component, a quencher (base) component, a chromophore component, a surfactant component, and/or other suitable component depending on requirements of the resist material 10. The present disclosure also contemplates embodiments where the resist component 16 interacts with components of the resist material 10, yet is not chemically bonded (or linked) to the polymer 12 as depicted in FIG. 1.

The resist material 10 further includes an acid generating component, such as a photoacid generator (PAG) component 18, which generates acid upon absorbing radiation. The PAG component 18 thus catalyzes cleaving of the ALG component 14 from the polymer 12 when exposed to radiation, deprotecting the ALG component 14 in exposed portions of the resist material 10 and changing characteristics (for example, polarity and/or solubility) of exposed portions of the resist material 10. For example, when the resist material 10 is exposed with radiation reaching a defined exposure dose threshold, exposed portions of the resist material 10 exhibit increased solubility in a developer (for a positive tone resist material). In some embodiments, the PAG component 18 includes a phenyl ring based functional group, a heterocyclic ring based functional group, other suitable functional group, or combinations thereof. In some embodiments, where the resist material 10 includes a quencher component, the quencher neutralizes acid, such that the quencher inhibits acid generated by the PAG component 18 from reacting with the ALG component 14. In some embodiments, the quencher is a photo-decomposable base (PDB) component.

The polymer 12, ALG component 14, resist component 16, and PAG component 18 are mixed in a solvent 20 to form the resist material 10. In some embodiments, the solvent 20 is an aqueous solvent. In some embodiments, the solvent 20 is an organic-based solvent, such as PGMEA (propylene glycol monomethyl ether acetate) (2-methoxy-1-methyl-ethylacetate), PGME (propylene glycol monomethyl ether), PGEE (propyleneglycol monoethylether), GBL (gamma-butyrolacetone), CHN (cyclohexanone, n-butyl acetate), MIBC (methyl isobutyl carbinol), 2-heptanone, other suitable organic-based solvent, or combinations thereof.

Figure 5A:
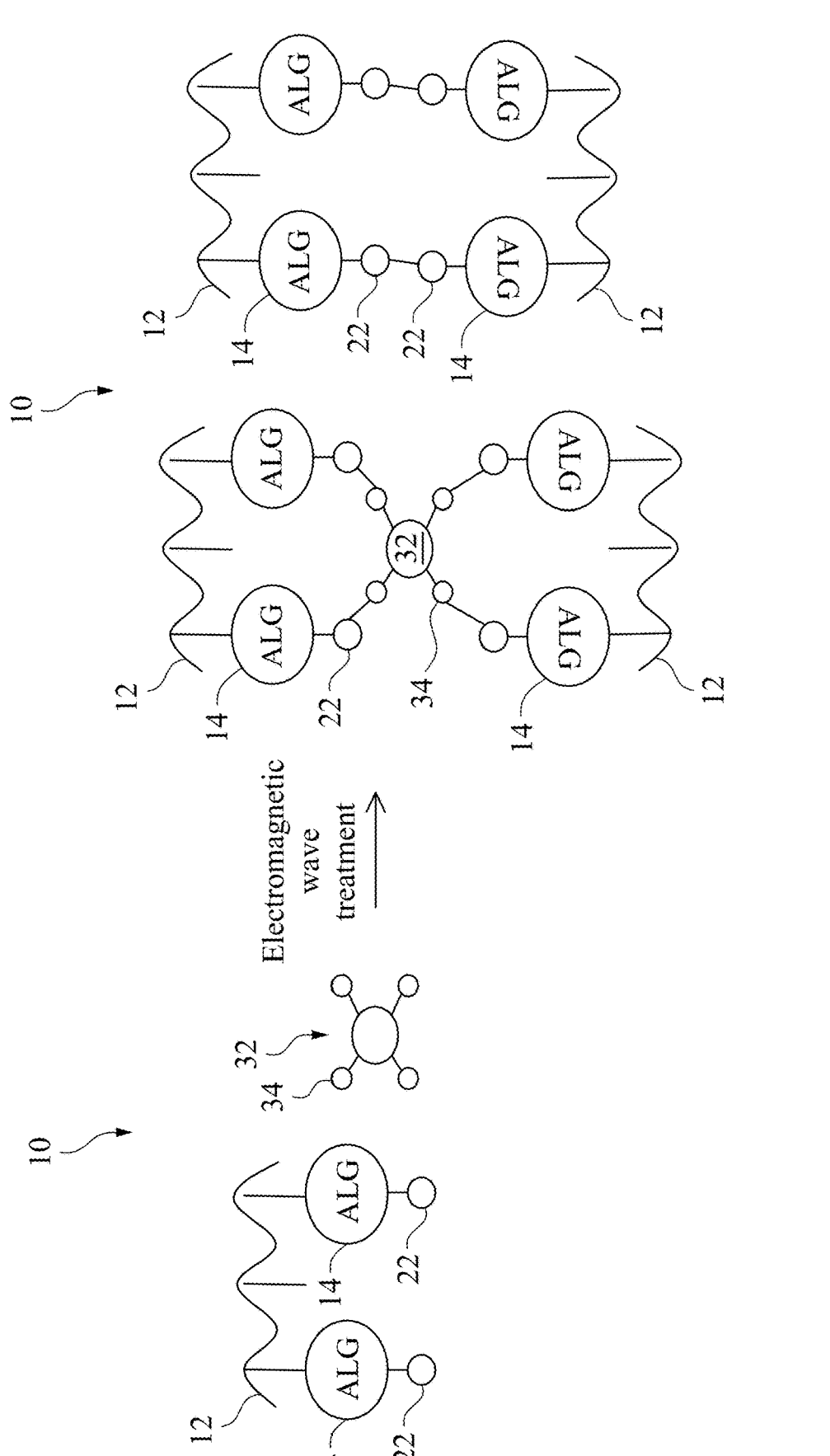
FIGS. 5A-5D illustrate a stage of a lithography process, in accordance with some embodiments.

FIGS. 5A-5D illustrate a stage of a lithography process, in accordance with some embodiments. As shown in FIG. 5A, a treatment is performed on the resist material 10. The resist material 10 includes the polymer 12, the ALG components 14, the cross-linker 32, and other components (not shown) described in FIG. 1. The treatment is performed to a resist layer including the resist material 10, and cross-linking occurs at an upper portion of the resist layer. In some embodiments, a cross-linking gradient is formed in the resist layer such that the degree of cross-linking increases from a bottom of the resist layer to a top of the resist layer. For example, cross-linking may not occur at the bottom of the resist layer, and full cross-linking may occur at the top of the resist layer. In some embodiments, the treatment is electromagnetic wave treatment. For example, the electromagnetic wave may include radio wave, microwave, infrared light, visible light, ultraviolet (UV) light, or other suitable electromagnetic wave. The wavelength of the electromagnetic wave may be single wavelength or broadband wavelength. The wavelength may be less than about 190 nm or greater than about 300 nm. For example, the main peak of the wavelength may be 365 nm, 172 nm, 156 nm, 120 nm, or the like. In some embodiments, the treatment is an UV treatment. In some embodiments, the treatment is controlled so only the upper portion of the resist layer is fully cross-linked, while the lower portion of the resist layer is not cross-linked or partially cross-linked. The electromagnetic wave energy and the treatment time may be controlled to form the resist layer having varying degrees of cross-linking. For example, the UV treatment energy may be less than about 500 W, and the treatment time may be less than about 300 seconds, such as from about 30 seconds to about 180 seconds. Different process conditions may be used for different polymers 12 of the resist material 10.

As shown in FIG. 5A, as a result of the treatment, segments of the polymer 12 are cross-linked via the cross-linker 32 and the cross-linkable functional groups 22. In some embodiments, each cross-linkable functional group 34 of the cross-linker 32 is bonded to a segment of the polymer 12. Thus, with the cross-linker 32 having 3 or 4 cross-linkable functional groups 34, 3 or 4 segments of the polymer 12 may be cross-linked, leading to increased molecular weight of the polymer 12. The cross-linkable functional group 22 attached to a segment of the polymer 12 may be bonded to the cross-linkable functional group 22 attached to another segment of the polymer 12, as shown in FIG. 5A. In some embodiments, the molecular weight of the segments of the polymer 12 cross-linked by the cross-linker 32 is greater than the molecular weight of segments of the polymer 12 cross-linked by the cross-linkable functional groups 22. The cross-linked segments of the polymer 12 via the cross-linker 32 and the cross-linkable functional groups 22 may be formed at the upper portion of the resist layer, and segments of the polymer 12 are not cross-linked at the lower portion of the resist layer. Thus, the upper portion of the resist layer has a molecular weight greater than the lower portion of the resist layer.

Figure 5B:
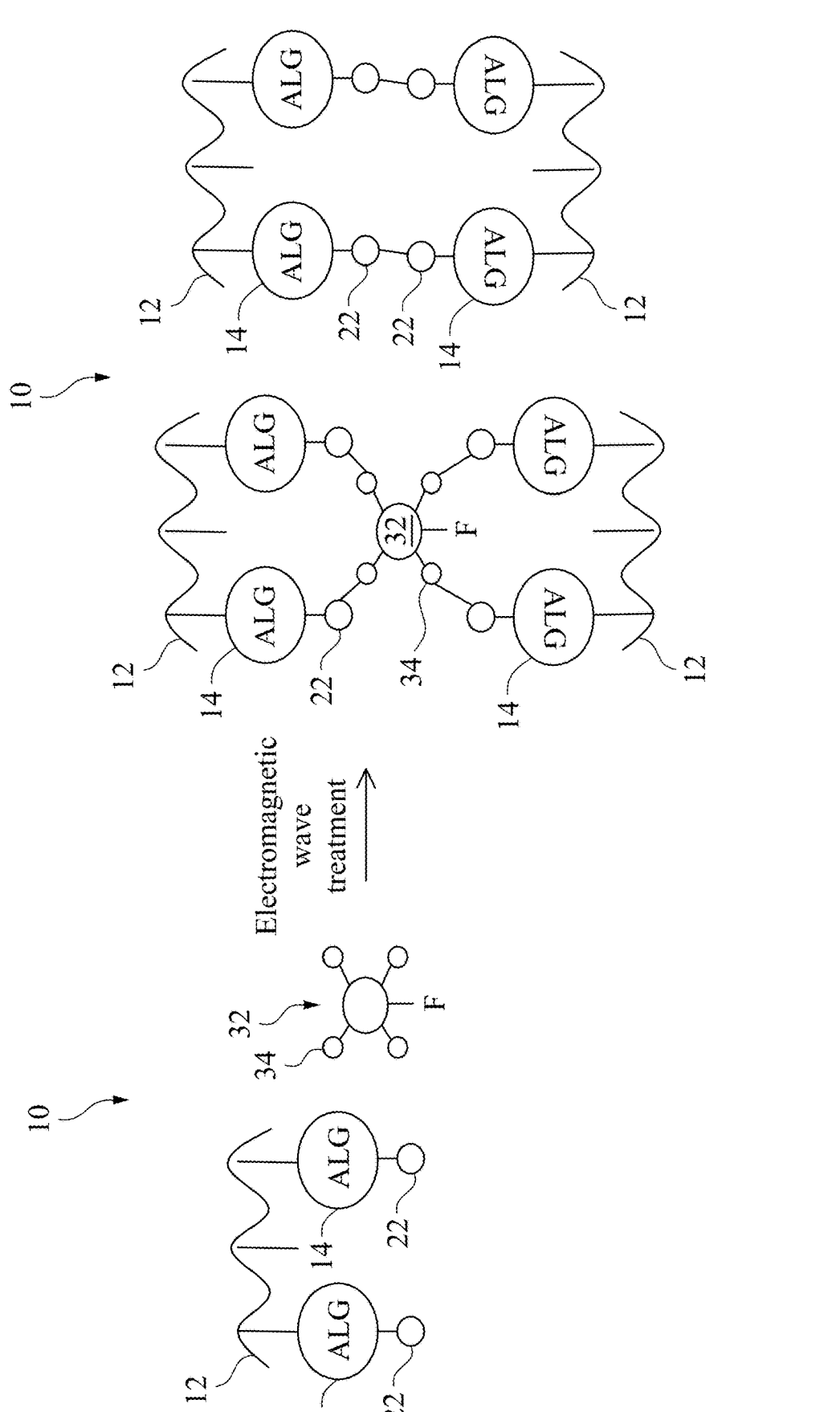

As shown in FIG. 5B, the cross-linker 32 is a fluorine-containing cross-linker 32, which floats to an upper surface of the resist layer during the formation of the resist layer. In some embodiments, the treatment has a larger processing window so cross-linking may occur throughout the thickness of the resist layer. Because the cross-linkers 32 are located near the upper surface of the resist layer, and the molecular weight of the segments of the polymer 12 cross-linked by the cross-linkers 32 is greater than the molecular weight of the segments of the polymer 12 cross-linked by the cross-linkable functional groups 22, the upper portion of the resist layer has a higher molecular weight than the lower portion of the resist layer.

Figure 5C:
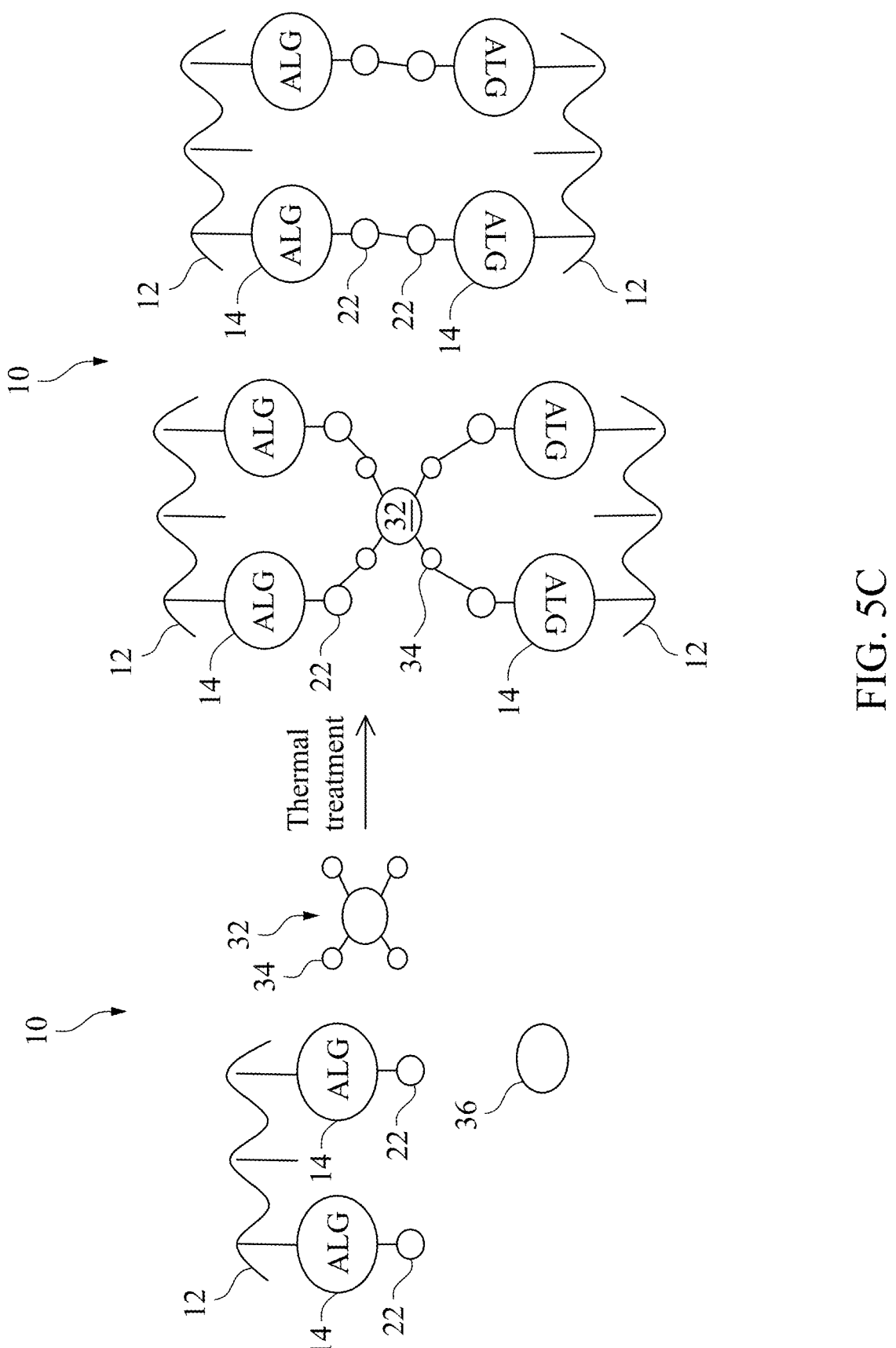
Figure 5D:
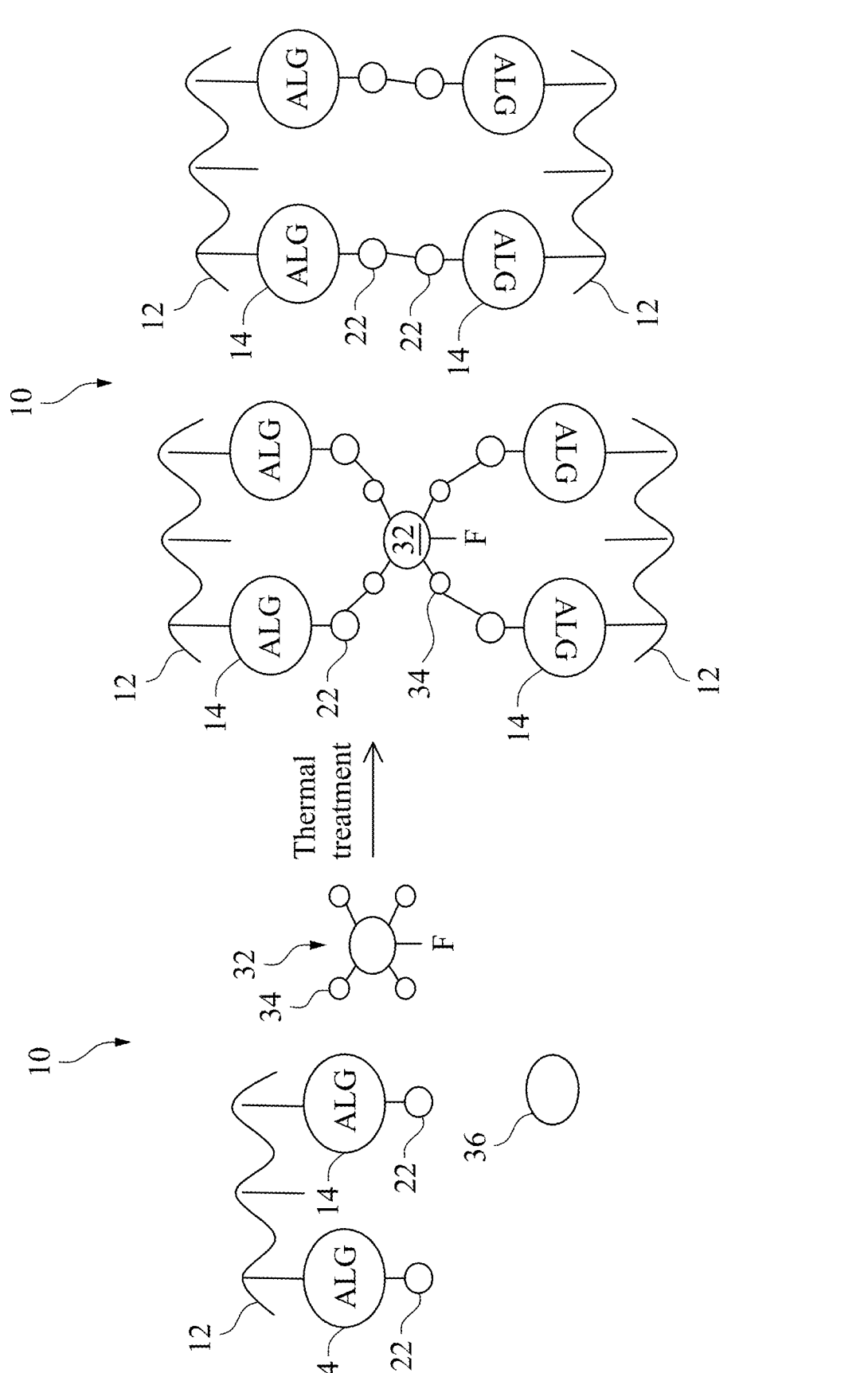

As shown in FIGS. 5C and 5D, instead of an electromagnetic wave treatment, a thermal treatment is performed on the resist material 10. The resist material 10 includes the polymer 12, the ALG components 14, the cross-linker 32, a thermal radical initiator 36, and other components (not shown) described in FIG. 1. The thermal treatment is performed to a resist layer including the resist material 10, and cross-linking occurs at an upper portion of the resist layer. In some embodiments, a cross-linking gradient is formed in the resist layer such that the degree of cross-linking increases from a bottom of the resist layer to a top of the resist layer. For example, cross-linking may not occur at the bottom of the resist layer, and full cross-linking may occur at the top of the resist layer. The thermal treatment may include heating the resist layer including the resist material 10 to a temperature less than about 150 degrees Celsius for less than about 150 seconds in order to cross-link the upper portion of the resist layer. For example, the thermal treatment may be heating the resist layer to a temperature less than about 130 degrees Celsius for about 10 seconds to about 120 seconds. If the temperature is higher than about 150 degrees Celsius and the time duration is longer than 150 seconds, the cross-linking may occur throughout the resist layer. Different process conditions may be used for different polymers 12 of the resist material 10.

Figures 6A, 6B:
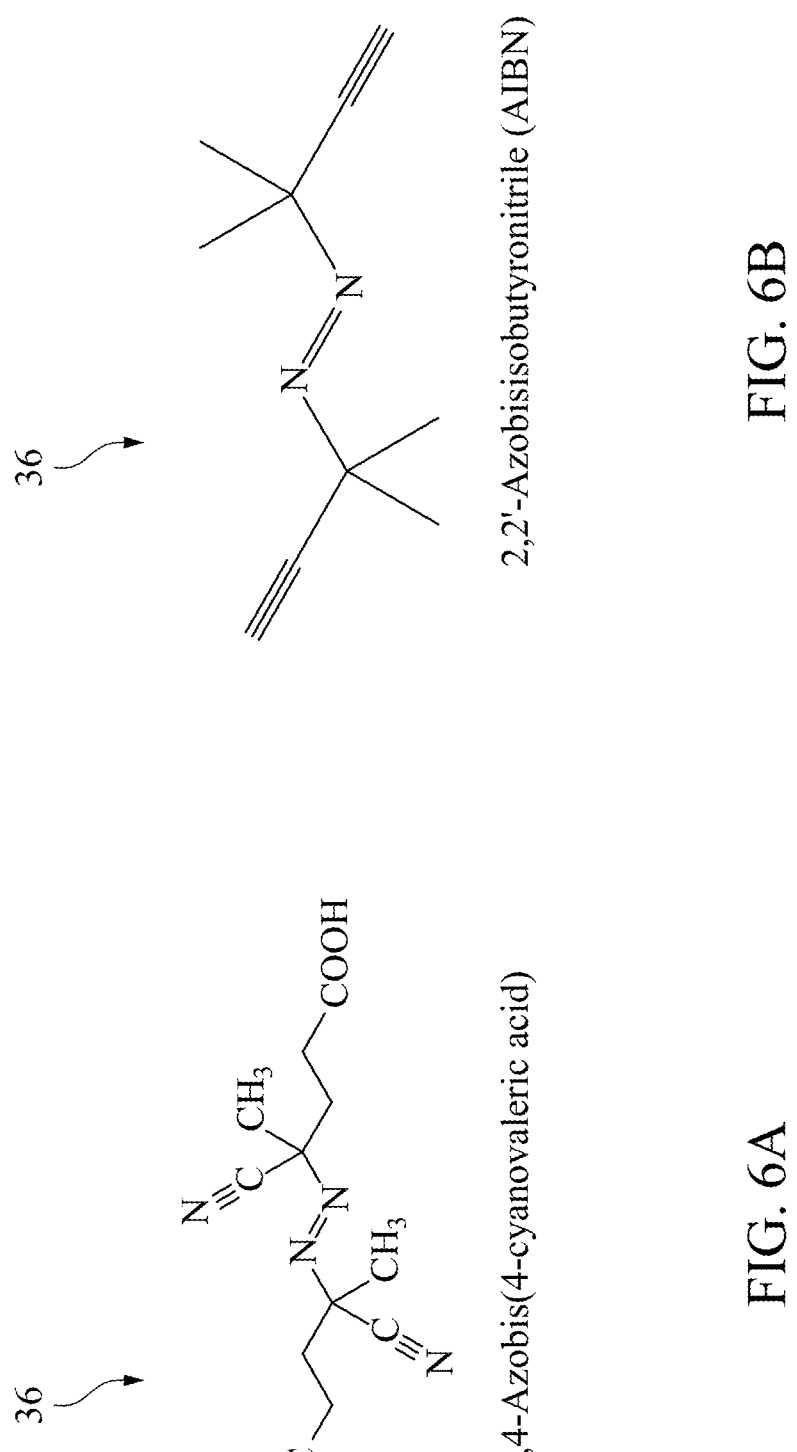
FIGS. 6A and 6B illustrate chemical structures of a thermal radical initiator that can be included in a resist material, such as the resist material of FIG. 1, in accordance with some embodiments.

The thermal radical initiator 36 initiates the cross-linking of the segments of the polymer 12. FIGS. 6A and 6B illustrate chemical structures of exemplary thermal radical initiator, such as the thermal radical initiator 36, that can be included in a resist material, such as the resist material 10, in according with some embodiments. The thermal radical initiator 36 may decompose at an elevated temperature. For example, after the cross-linking is initiated, the thermal radical initiator 36 decomposes at the temperature of the thermal treatment.

Figure 7:
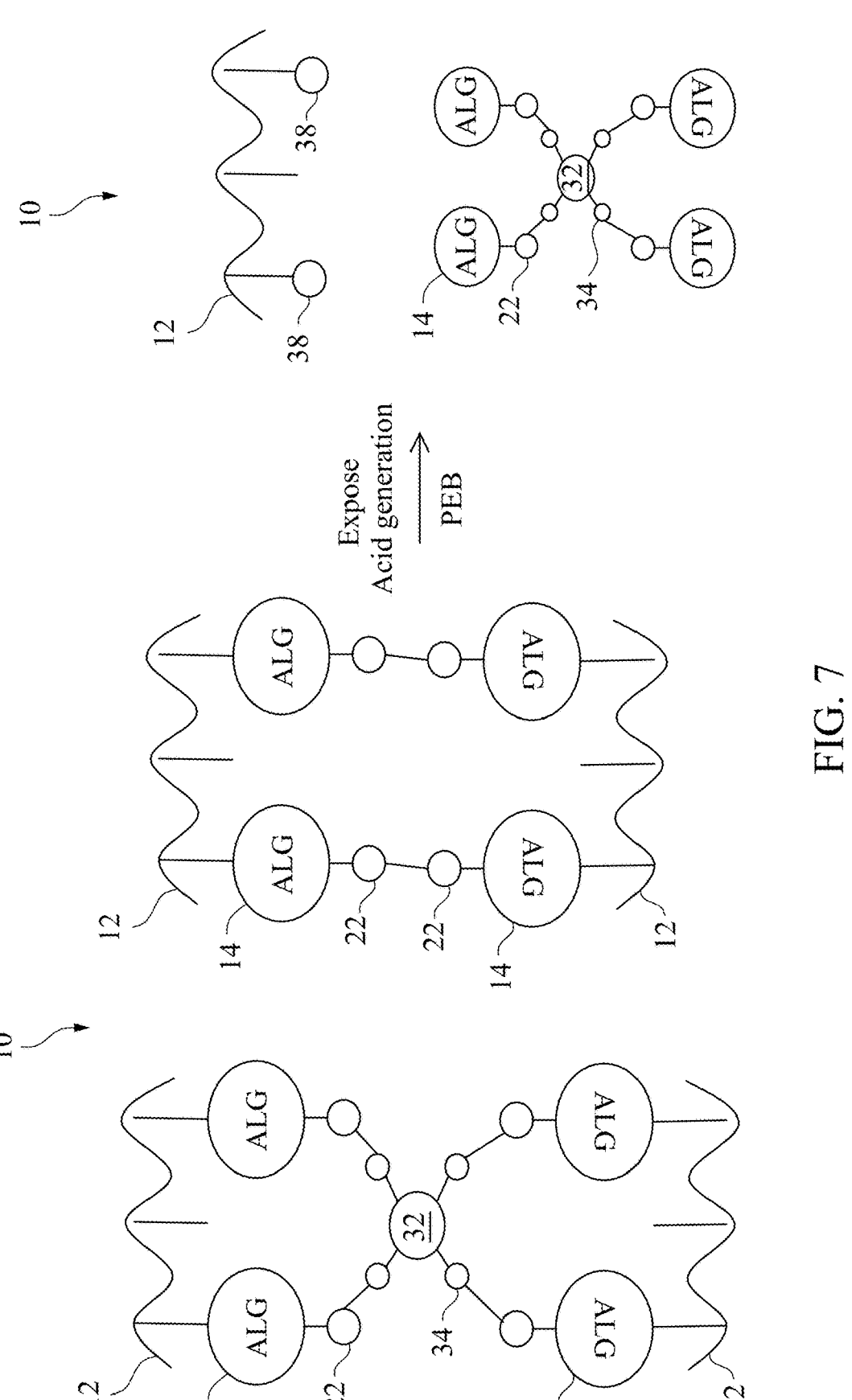
FIG. 7 illustrates a stage of the lithography process, in accordance with some embodiments.

FIG. 7 illustrates a stage of the lithography process, in accordance with some embodiments. As shown in FIG. 7, after the electromagnetic wave treatment or the thermal treatment that forms the resist layer including the upper portion having a higher molecular weight than that of the lower portion, portions of the resist layer are exposed to the radiation, which causes the PAG component 18 (FIG. 1) in the exposed portions to generate acid upon absorbing the radiation and catalyze cleaving of the ALG component 14 from the polymer 12. In some embodiments, a post exposure bake (PEB) process is performed on the resist layer to cause the ALG component 14 to cleave from the polymer 12, as shown in FIG. 7. The PAG component 18 thus deprotects the ALG component 14 in the exposed portions, changing a branch unit of the polymer 12 into a carboxyl-containing component 38, such as COOH. This makes the exposed portions of the resist layer more hydrophilic and increases solubility of the exposed portions of the resist layer to a developer, such as a PTD developer. For example, a base of the developer reacts with the carboxyl-containing component 38 to form an ionic pair as the developer penetrates the exposed portions, such that the developer can dissolve the exposed portions. An example of the PTD developer is 2.38 percent TMAH. The cleaved ALG components 14 and the cross-linker 32 may be removed from the resist layer by the developer. In some embodiments, the cross-linker 32 bonded to 2, 3, or 4 ALG components together may have a molecular weight less than about 1000.

FIGS. 8A-8F are fragmentary cross-sectional views of a workpiece, in portion or entirety, at various fabrication stages (such as those associated with the lithography process), in accordance with some embodiments. The workpiece 200 is depicted at an intermediate stage of fabrication (or processing) of an IC device, such as a microprocessor, a memory, and/or other IC device. In some embodiments, the workpiece 200 may be a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, fin-like field effect transistors (FinFETs), nanosheet transistors, other suitable IC components, or combinations thereof. FIGS. 8A-8F have been simplified for the sake of clarity to better understand the concepts of the present disclosure. Additional features can be added to workpiece 200, and some of the features described below can be replaced, modified, or eliminated in other embodiments of the workpiece 200.

Figure 8A:
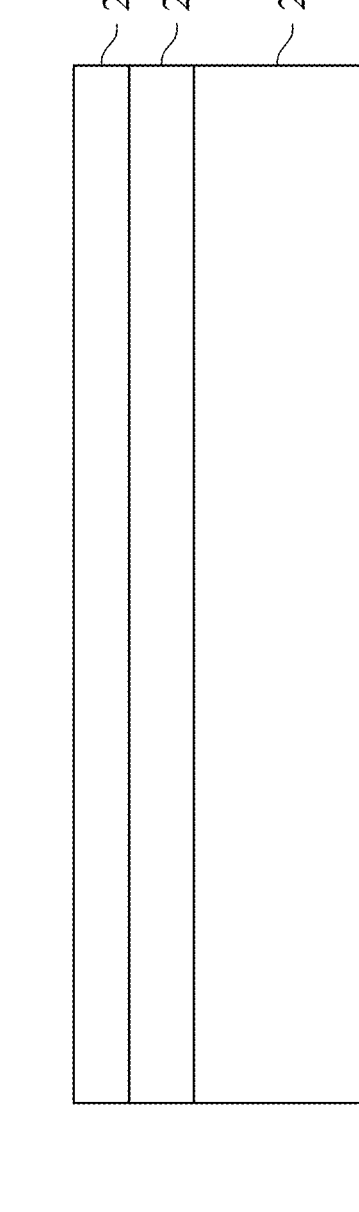
FIGS. 8A-8F are fragmentary cross-sectional views of a workpiece, in portion or entirety, at various fabrication stages (such as those associated with the lithography process), in accordance with some embodiments.

As shown in FIG. 8A, the workpiece 200 includes a wafer 210, which includes a substrate (for example, a semiconductor substrate), a mask (also referred to as a photomask or reticle), or any base material on which processing may be conducted to provide layers of material to form various features of an IC device. Depending on IC fabrication stage, the wafer 210 includes various material layers (for example, dielectric layers, semiconductor layers, and/or conductive layers) configured to form IC features (for example, doped regions/features, isolation features, gate features, source/drain features (including epitaxial source/drain features), interconnect features, other features, or combinations thereof). In the depicted embodiment, the wafer 210 includes a semiconductor substrate, such as a silicon substrate. Alternatively or additionally, the wafer 210 includes another elementary semiconductor, such as germanium; a compound semiconductor, such as silicon carbide, gallium arsenide, gallium phosphide, indium phosphide, indium arsenide, and/or indium antimonide; an alloy semiconductor, such as SiGe, GaAsP, AnnAs, AlGaAs, GaInAs, GaInP, and/or GaInAsP; or combinations thereof. Alternatively, the wafer 210 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

A material layer 220 to be processed (also referred to herein as an underlying layer) is disposed over the wafer 210. However, the present disclosure contemplates embodiments where the material layer 220 is omitted, such that the wafer 210 is directly processed. In some embodiments, the material layer 220 includes a conductive material or a semiconductor material, such as metal or metal alloy. In some embodiments, the metal includes titanium (Ti), aluminum (Al), tungsten (W), tantalum (Ta), copper (Cu), cobalt (Co), ruthenium (Ru), other suitable metal, or combinations thereof. In some embodiments, the metal alloy includes metal nitride, metal sulfide, metal selenide, metal oxide, metal silicide, other suitable metal alloy, or combinations thereof. In some embodiments, the material layer 220 is a hard mask layer to be patterned for use in subsequent processing of workpiece 200. In some embodiments, the material layer 220 is an anti-reflective coating (ARC) layer. In some embodiments, the material layer 220 is a layer to be used for forming a gate feature (for example, a gate dielectric and/or a gate electrode), a source/drain feature (for example, an epitaxial source/drain), and/or a contact feature (for example, a conductive or dielectric feature of a multilayer interconnect (MLI)) of the workpiece 200. In some embodiments, where the workpiece 200 is fabricated into a mask for patterning IC devices, the wafer 210 can be a mask substrate that includes a transparent material (for example, quartz) or a low thermal expansion material (for example, silicon oxide titanium). In such embodiments, the material layer 220 is a layer to be processed to form an IC pattern therein, such as an absorber layer (for example, material layer 220 includes chromium).

A resist layer 230 is formed over the wafer 210 by any suitable process. The resist layer 230 is also referred to as a photoresist layer, photosensitive layer, imaging layer, patterning layer, or radiation sensitive layer. The resist layer 230 is sensitive to radiation used during a lithography exposure process, such as DUV radiation, EUV radiation, e-beam radiation, ion beam radiation, and/or other suitable radiation. In some embodiments, the resist layer 230 is sensitive to radiation having a wavelength less than about 250 nm. In the depicted embodiment, the resist layer 230 is formed by spin coating a liquid resist material, such as resist material 10 described above, onto a material layer to be processed, such as the material layer 220. For example, the resist layer 230 includes the polymer 12, the ALG component 14 having the cross-linkable functional group 22 bonded thereto, the resist component 16, the PAG component 18, the cross-linker 32, and/or other suitable resist components mixed in the solvent 20. In some embodiments, the resist layer 230 further includes the thermal radical initiator 36 mixed in the solvent 20. After spin coating the liquid resist material (but before performing an exposure process), a pre-bake process can be performed on the resist layer 230, for example, to evaporate solvent (such as the solvent 20) and to densify the liquid resist material formed over the material layer 220. In some embodiments, the resist layer 230 includes the fluorine-containing cross linkers 32, and the fluorine-containing cross linkers 32 float to an upper portion 245 (FIG. 8B) during the spin coating of the resist layer 230. In some embodiments, before forming the resist layer 230, an ARC layer is formed over the material layer 220, such that the resist layer 230 is formed over the ARC layer. The ARC layer may be a nitrogen-free ARC (NFARC) layer that includes a material such as $SiO_2$, silicon oxygen carbide (SOC), plasma enhanced chemical vapor deposited silicon oxide (PECVD-$SiO_2$), other suitable material, or combinations thereof. In some embodiments, more than one layer (including one or more ARC layers) can be formed between the material layer 220 and the resist layer 230.

Figure 8B:
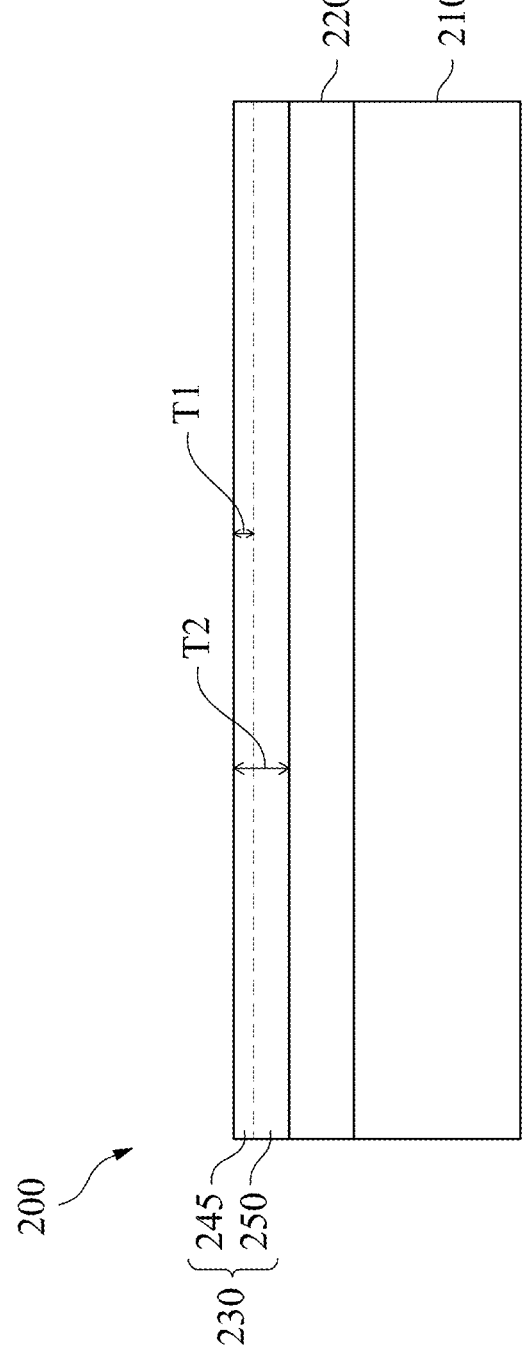

As shown in FIG. 8B, a treatment is performed on the resist layer 230. The treatment may be the electromagnetic wave treatment or the thermal treatment described in FIGS. 5A-5D. As described in FIGS. 5A and 5C, the treatment is controlled so that full cross-linking occurs at an upper portion 245 of the resist layer 230, and partial cross-linking or no cross-linking occurs at a lower portion 250 of the resist layer 230. In some embodiments, the degree of cross-linking increases from the lower portion 250 to the upper portion 245. The treatment is controlled so the electromagnetic wave or the thermal energy does not reach the lower portion 250 to cause cross-linking. As a result, the upper portion 245 of the resist layer 230 has a first molecular weight, and the lower portion 250 of the resist layer 230 has a second molecular weight less than the first molecular weight. Alternatively, the fluorine-containing cross-linkers 32 (FIGS. 5B and 5D) are used, and cross-linking may occur throughout the thickness of the resist layer 230. Because the fluorine-containing cross-linkers 32 are located at the upper portion 245 of the resist layer 230, the upper portion 245 has the first molecular weight greater than the second molecular weight of the lower portion 250. In some embodiments, the upper portion 245 has a thickness T1 and the resist layer 230 has a thickness T2. The thickness T1 may be about 5 percent to about 20 percent of the thickness T2. If the thickness T1 is less than about 5 percent of the thickness T2, the unexposed portion of the resist layer 230 may suffer film loss during the developing stage. If the thickness T1 is greater than about 20 percent of the thickness T2, defects such as scum may occur during the developing stage.

Figure 8C:
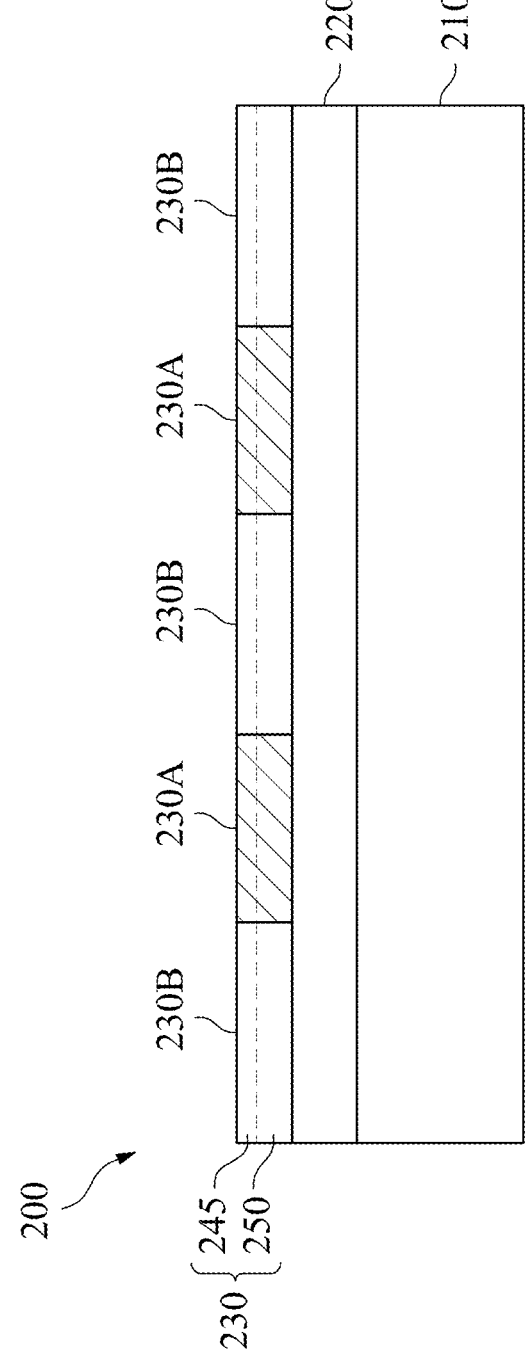

As shown in FIG. 8C, an exposure process is performed on the resist layer 230, where the resist layer 230 is illuminated with patterned radiation. In some embodiments, the resist layer 230 is exposed to patterned radiation having a wavelength less than about 250 nm, such as DUV radiation, EUV radiation, x-ray radiation, e-beam radiation, ion-beam radiation, and/or other suitable radiation. The exposure process can be in air, liquid (immersion lithography), or vacuum (for example, when implementing EUV lithography and/or e-beam lithography). In some embodiments, the radiation is patterned using a mask (not shown) having an IC pattern defined therein, such that the patterned radiation forms an image of the IC pattern on the resist layer 230. The mask transmits, absorbs, and/or reflects the radiation depending on the IC pattern, along with mask technologies used to fabricate the mask. Various resolution enhancement techniques, such as phase-shifting, off-axis illumination (OAI), and/or optical proximity correction (OPC), may be implemented through the mask or the exposing process. In some embodiments, the radiation beam is patterned by directly modulating the radiation beam according to an IC pattern without using a mask (often referred to as maskless lithography).

A latent pattern is formed on the resist layer 230 by the exposure process. The latent pattern generally refers to a pattern exposed on the resist layer 230, which eventually becomes a physical resist pattern when the resist layer 230 is subjected to a developing process. The latent pattern includes exposed portions 230A and unexposed portions 230B. Both the exposed portions 230A and the unexposed portions 230B include the upper portion 245 and the lower portion 250, as shown in FIG. 8C. In the depicted embodiment, the exposed portions 230A physically and/or chemically change in response to the exposure process. For example, the PAG components 18 (FIG. 1) in the exposed portions 230A of the resist layer 230 generate acid upon absorbing radiation, which functions as a catalyst for causing chemical reactions that increase solubility of the exposed portions 230A. For example, acid generated from the PAG components 18 (FIG. 1) catalyzes cleaving of ALG components 14 (FIG. 1) from the polymers 12 (FIG. 1) in the exposed portions 230A of the resist layer 230. In some embodiments, after the exposure process, a post-exposure baking (PEB) process is performed on the resist layer 230. The PEB process increases a temperature of the resist layer 230 to about 80 degrees Celsius to about 180 degrees Celsius. In some embodiments, the PEB process is performed in a thermal chamber, increasing a temperature of the resist layer 230 to about 120 degrees Celsius to about 150 degrees Celsius. The temperature of thermal treatment described in FIGS. 5C and 5D may be less than the temperature of the PEB process in order to avoid cleaving the ALG components 14 during the thermal treatment. During the PEB process, the ALG components 14 (FIG. 1) cleave from the polymers 12 (FIG. 1) in the exposed portions 230A of the resist layer 230, thereby chemically changing the exposed resist portions 230A. Both the upper portion 245 and the lower portion 250 of the exposed portions 230A may be changed by the radiation. For example, in the depicted embodiment, the exposure process and/or the PEB process increase hydrophilicity of the exposed portions 230A (in other words, the polymers 12 (FIG. 1) become more hydrophilic), increasing solubility of the exposed portions 230A to a developer. The exposure and PEB processes may be the exposure and PEB processes described in FIG. 7.

Figure 8D:
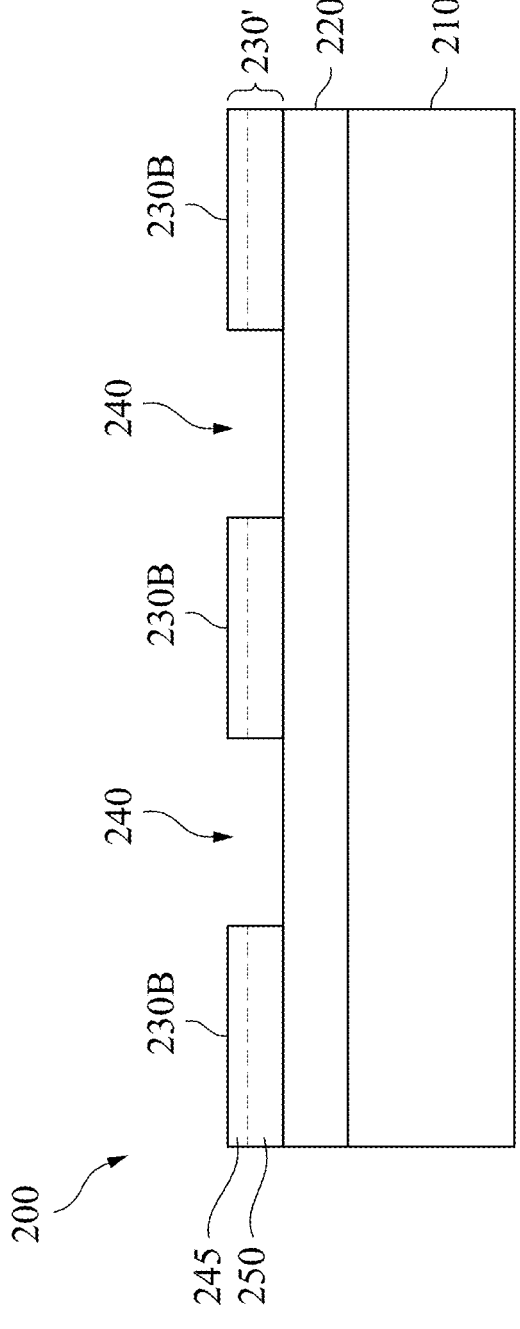

As shown in FIG. 8D, a developing process is performed on the resist layer 230, thereby forming patterned resist layer 230'. In the depicted embodiment, a positive tone development (PTD) process is performed to remove the exposed portions 230A of the resist layer 230. For example, a PTD developer is applied to the resist layer 230 that dissolves the exposed portions 230A, leaving patterned resist layer 230' having openings 240 defined therein between the unexposed portions 230B (collectively referred to as a resist pattern). In some embodiments, the PTD developer includes an aqueous base solvent, such as TMAH or tetrabutylammonium hydroxide (TBAOH). By cross-linking the upper portion 245 of the unexposed portions 230B of the patterned resist layer 230' as described herein, the developing process is unable to penetrate the unexposed portions 230B, causing minimal film loss of the unexposed portions 230B. On the other hand, the developing process is able to remove the lower portion 250 of the exposed portions 230A (FIG. 8C) with minimum scum formation.

Figure 8E:
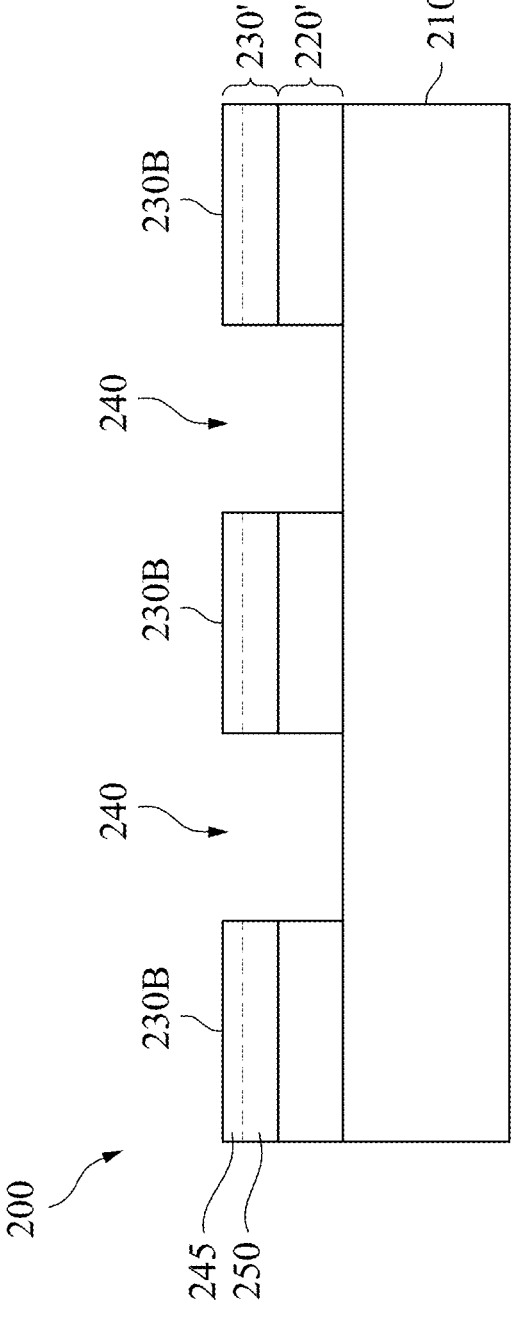
Figure 8F:
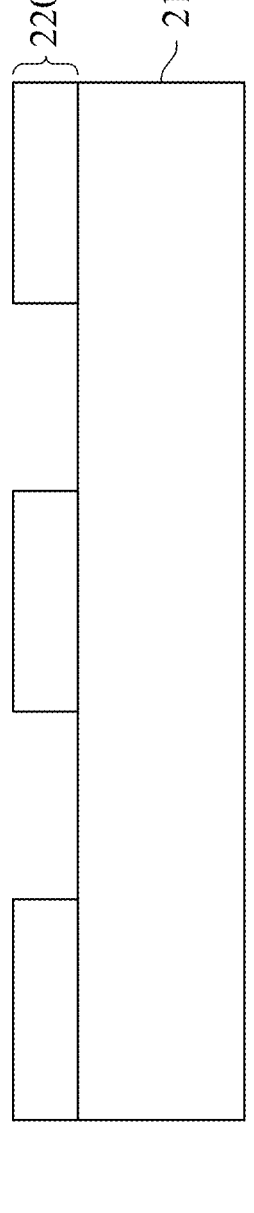

As shown in FIG. 8E, a fabrication process is performed on workpiece 200, such as on the material layer 220 and/or the wafer 210, using the patterned resist layer 230' as a mask. For example, the fabrication process is applied only to portions of the workpiece 200 within openings 240 of the patterned resist layer 230', while other portions of the workpiece 200 covered by the patterned resist layer 230' are protected from being impacted by the fabrication process. In some embodiments, the fabrication process includes performing an etching process on the material layer 220 using the patterned resist layer 230' as an etching mask. A pattern is thus transferred from the patterned resist layer 230' to the material layer 220, thereby forming the patterned material layer 220'. In embodiments where the material layer 220 is a hard mask layer, the pattern is first transferred from the patterned resist layer 230' to the material layer 220, and then the pattern is transferred from patterned material layer 220' to a material layer of the wafer 210. The etching process includes a dry etching process, a wet etching process, other suitable etching process, or combinations thereof. Alternatively, in some embodiments, the fabrication process includes performing an implantation process on the material layer 220 using the patterned resist layer 230' as an implant mask, thereby forming various doped features (regions) in the material layer 220. Thereafter, as shown in FIG. 8F, the patterned resist layer 230' is removed from the workpiece 200 using any suitable process, such as a resist stripping process, leaving the patterned material layer 220' disposed over the wafer 210. In some embodiments, the patterned resist layer 230' may be partially consumed during the fabrication process, such as during the etching process, such that any remaining portion of the patterned resist layer 230' is subsequently removed by the resist stripping process.

Figure 9A:
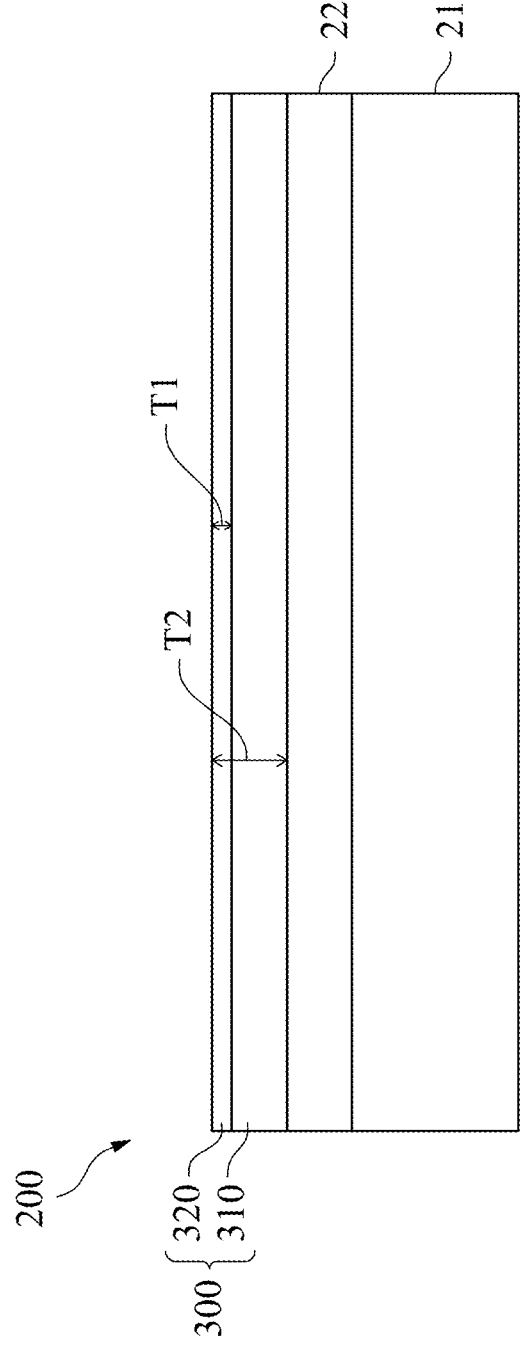
FIGS. 9A-9C are fragmentary cross-sectional views of a workpiece, in portion or entirety, at various fabrication stages (such as those associated with the lithography process), in accordance with alternative embodiments.
Figure 9B:
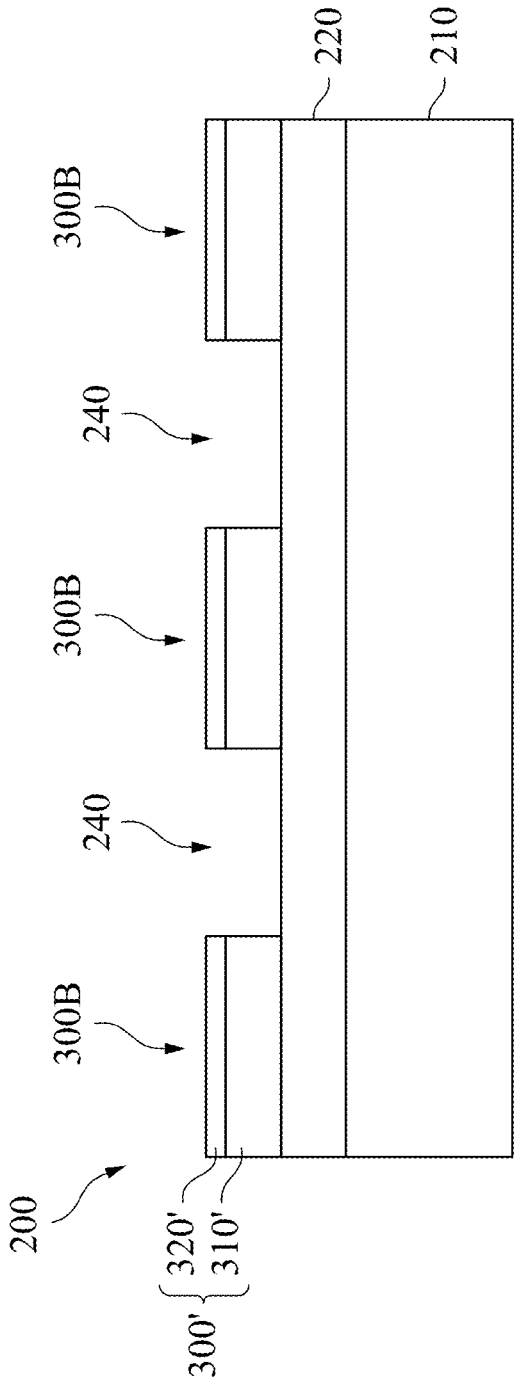
Figure 9C:
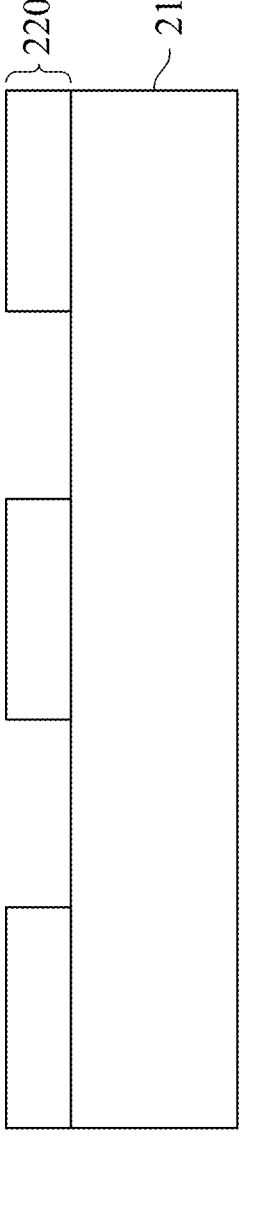

FIGS. 9A-9C are fragmentary cross-sectional views of a workpiece 200, in portion or entirety, at various fabrication stages (such as those associated with the lithography process), in accordance with alternative embodiments. As shown in FIG. 9A, the workpiece 200 includes the wafer 210, the material layer 220, and a resist layer 300. Unlike the resist layer 230 shown in FIG. 8A, the resist layer 300 includes a first resist layer 310 and a second resist layer 320. The first resist layer 310 may be formed over the material layer 220 by any suitable process, such as spin coating followed by a pre-bake process. The first resist layer 310 may include the resist material 10 (FIG. 1) but without the cross-linker 32, the cross-linkable functional groups 22, and the thermal radical initiator 36 (FIG. 5C). Thus, even if the electromagnetic wave or the thermal energy of the treatment reaches the first resist layer 310, no cross-linking would occur, and the molecular weight of the first resist layer 310 does not increase as the result of the treatment. The second resist layer 320 may include the resist material 10 (FIG. 1) having the polymer 12, the ALG component 14 having the cross-linkable functional group 22 bonded thereto, the resist component 16, the PAG component 18, the cross-linker 32, and/or other suitable resist components mixed in the solvent 20. In some embodiments, the second resist layer 320 further includes the thermal radical initiator 36 mixed in the solvent 20. In some embodiments, the second resist layer 320 includes the same materials as the resist layer 230 (FIG. 8A), and the first resist layer 310 includes the same materials as the second resist layer 320 but without the cross-linker 32, the cross-linkable functional groups 22, and the thermal radical initiator 36. The second resist layer 320 may have a thickness T1 and the resist layer 300 may have the thickness T2, as shown in FIG. 9A. The thickness T1 may be about 5 percent to about 20 percent of the thickness T2.

The treatment is performed on the resist layer 300. The treatment may be performed using the electromagnetic wave or thermal energy, and the treatment may have larger processing windows compared to the treatment performed to the resist layer 230 shown in FIG. 8B. Because the first resist layer 310 does not include the cross-linker 32 or the cross-linkable functional groups 22, the polymers of the first resist layer 310 would not cross-link even if the electromagnetic wave or the thermal energy reaches the first resist layer 310. Cross-linking may occur in the second resist layer 320 as a result of the treatment. The second resist layer 320 may be cross-linked throughout the entire thickness T1, unlike the resist layer 230 where only the upper portion 245 is cross-linked. The second resist layer 320 has a higher molecular weight than a molecular weight of the first resist layer 310.

As shown in FIG. 9B, the exposure process and the developing process are performed on the resist layer 300 to form a patterned resist layer 300'. The patterned resist layer 300' includes the patterned resist layers 310', 320'. The exposure process may be the same as the exposure process described in FIG. 8C, and the developing process may be the same as the developing process described in FIG. 8D. For example, the exposure process forms the exposed portions (not shown) and the unexposed portions 300B of the resist layer 300, and the exposed portions are removed by the developing process. Both the exposed portions and the unexposed portions 300B include the second resist layer 320 and the first resist layer 310. The exposed portions of second resist layer 320 and the portions of the first resist layer 310 disposed therebelow may be chemically and/or physically changed by the exposure process, such as becoming more hydrophilic as described in FIG. 8C. The cross-linked second resist layer 320 in the unexposed portions 300B leads to reduced film loss of the unexposed portions 300B because the developing process is unable to penetrate the second resist layer 320 of the unexposed portions 230B. On the other hand, the developing process is able to remove the first resist layer 310 of the exposed portions with minimum scum formation.

As shown in FIG. 9C, the pattern of the patterned resist layer 300' is transferred to the material layer 220 to form the patterned material layer 220', and the patterned resist layer 300' is removed.

The present disclosure in various embodiments provides resist materials and corresponding lithography techniques that can reduce the bridge and blind defects in a resist layer. The lithography techniques include forming a resist layer 230 and treating the resist layer 230 so the resist layer 230 has an upper portion 245 having a first molecular weight and a lower portion 250 having a second molecular weight less than the first molecular weight. Some embodiments may achieve advantages. For example, the developing process is unable to penetrate the upper portion 245 of the unexposed portions 230B, causing minimal film loss of the unexposed portions 230B. Furthermore, the developing process is able to remove the lower portion 250 of the exposed portions 230A with minimum scum formation.

An embodiment is a lithography method. The method includes forming a resist layer over a substrate, performing a treatment on the resist layer to form an upper portion of the resist layer having a first molecular weight and a lower portion of the resist layer having a second molecular weight less than the first molecular weight, performing an exposure process on the resist layer, and performing a developing process on the resist layer to form a patterned resist layer.

Another embodiment is a lithography method. The method includes forming a resist layer over a substrate, and the resist layer includes a fluorine-containing cross-linker disposed in an upper portion of the resist layer. The method further includes treating the resist layer, and a degree of cross-linking increases from a lower portion of the resist layer to the upper portion of the resist layer. The method further includes performing an exposure process on the resist layer and performing a developing process on the resist layer to form a patterned resist layer.

A further embodiment is a lithography method. The method includes forming a first resist layer over a substrate, forming a second resist layer over the first resist layer, and performing a treatment on the second resist layer to increase a first molecular weight of the second resist layer. The first resist layer has a second molecular weight less than the first molecular weight. The method further includes performing an exposure process on the first and second resist layers and performing a developing process on the first and second resist layers to form patterned first and second resist layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A lithography method, comprising:
   forming a resist layer over a substrate, wherein the resist layer comprises a polymer;
   performing a treatment on the resist layer to form a first portion of the polymer having a first molecular weight and a second portion of the polymer having a second molecular weight less than the first molecular weight, wherein the first portion is located over the second portion;
   performing an exposure process on the resist layer; and
   performing a developing process on the resist layer to form a patterned resist layer.

2. The lithography method of claim 1, wherein the exposure process comprises exposing the resist layer to a patterned radiation to form an exposed portion and an unexposed portion located adjacent the exposed portion.

3. The lithography method of claim 2, wherein exposed portion and the unexposed portion each includes the first and second portions of the polymer.

4. The lithography method of claim 2, wherein the exposed portion of the resist layer has an increased solubility compared to the unexposed portion of the resist layer.

5. The lithography method of claim 2, wherein the treatment comprises exposing the resist layer to an electromagnetic wave different from the patterned radiation.

6. The lithography method of claim 5, wherein the electromagnetic wave comprises ultraviolet light.

7. The lithography method of claim 1, wherein the resist layer further comprises a thermal radical initiator and the treatment comprises heating the resist layer.

8. The lithography method of claim 7, further comprising a post exposure bake process after the exposure process and before the developing process, wherein the post exposure bake process comprises heating the resist layer to a first temperature ranging from 120 degrees Celsius to 150 degrees Celsius.

9. The lithography method of claim 8, wherein the resist layer is heated to a second temperature less than the first temperature.

10. A lithography method, comprising:
    forming a resist layer over a substrate, wherein the resist layer comprises a polymer and a cross-linker;
    treating the resist layer by a first process, wherein a degree of cross-linking increases from a lower portion of the polymer to an upper portion of the polymer;
    performing an exposure process on the resist layer by a second process different from the first process; and
    performing a developing process on the resist layer to form a patterned resist layer.

11. The lithography method of claim 10, wherein the first process comprises exposing the resist layer to an electromagnetic wave.

12. The lithography method of claim 11, wherein the electromagnetic wave comprises ultraviolet light.

13. The lithography method of claim 10, wherein the resist layer further comprises a thermal radical initiator and the first process comprises heating the resist layer.

14. The lithography method of claim 13, further comprising performing a post-exposure baking process after the exposure process, wherein the post-exposure baking process has a process temperature ranging from 120 degrees Celsius to 150 degrees Celsius, wherein the resist layer is heated to a temperature less than the process temperature of the second process.

15. The lithography method of claim 10, wherein the resist layer comprises an exposed portion and an unexposed portion after the exposure process.

16. The lithography method of claim 15, wherein the exposed portion is removed by the developing process.

17. A lithography method, comprising:

forming a first resist layer over a substrate, wherein the first resist layer comprises a first polymer and a first number of components;

forming a second resist layer over the first resist layer, wherein the second resist layer comprises a second polymer and a second number of components greater than the first number of components;

performing a treatment on the second resist layer;

performing an exposure process on the first and second resist layers; and performing a developing process on the first and second resist layers to form patterned first and second resist layers.

18. The lithography method of claim 17, wherein the second resist layer further comprises a cross-linker, and the first resist layer is free of a cross-linker.

19. The lithography method of claim 17, wherein the second resist layer further comprises a thermal radical initiator, and the first resist layer is free of a thermal radical initiator.

20. The lithography method of claim 17, wherein the treatment increases a molecular weight of the second polymer but not a molecular weight of the first polymer.

* * * * *